United States Patent
Lidow et al.

(10) Patent No.: US 8,785,974 B2
(45) Date of Patent: Jul. 22, 2014

(54) BUMPED, SELF-ISOLATED GAN TRANSISTOR CHIP WITH ELECTRICALLY ISOLATED BACK SURFACE

(75) Inventors: Alexander Lidow, Marina Del Ray, CA (US); Robert Beach, La Crescenta, CA (US); Alana Nakata, Redondo Beach, CA (US); Jianjun Cao, Torrance, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 239 days.

(21) Appl. No.: 12/756,975

(22) Filed: Apr. 8, 2010

(65) Prior Publication Data

US 2010/0258844 A1 Oct. 14, 2010

Related U.S. Application Data

(60) Provisional application No. 61/167,773, filed on Apr. 8, 2009.

(51) Int. Cl.
*H01L 29/772* (2006.01)
*H01L 23/367* (2006.01)

(52) U.S. Cl.
USPC ........... 257/192; 257/706; 257/707; 257/737; 257/738; 257/780; 257/E29.242

(58) Field of Classification Search
USPC .................................. 257/737, 738
See application file for complete search history.

(56) References Cited

U.S. PATENT DOCUMENTS

| | | | |
|---|---|---|---|
| 7,745,848 B1 * | 6/2010 | Rajagopal et al. | 257/192 |
| 2005/0145851 A1 * | 7/2005 | Johnson et al. | 257/76 |
| 2006/0220042 A1 * | 10/2006 | Yaegashi et al. | 257/94 |
| 2008/0124834 A1 * | 5/2008 | Fujimori et al. | 438/106 |
| 2010/0258844 A1 * | 10/2010 | Lidow et al. | 257/192 |

* cited by examiner

*Primary Examiner* — Victor A Mandala
*Assistant Examiner* — William Harriston
(74) *Attorney, Agent, or Firm* — Dickstein Shapiro LLP

(57) ABSTRACT

A semiconductor device comprising a silicon substrate, a compound semiconductor material, an insulating material between the silicon substrate and the compound semiconductor material, and a top surface comprising means of electrical connection, and passivation material, where the passivation material is silicon nitride, silicon dioxide, or a combination of both. The present invention eliminates the need for a thick electrical insulator between a heat sink and the back surface of a surface mounted device by the inclusion of an AlN seed layer to electrically isolate the silicon substrate of the device. The sidewalls of the device are also electrically isolated from the active area of the device.

11 Claims, 4 Drawing Sheets

BUMPED, SELF-ISOLATED GAN TRANSISTOR CHIP WITH ELECTRICALLY ISOLATED BACK SURFACE

CROSS REFERENCE TO RELATED APPLICATIONS

This application claims priority from U.S. Provisional Application No. 61/167,773, filed on Apr. 8, 2009, which is hereby incorporated by reference in its entirety.

BACKGROUND

Devices made in silicon have been mounted directly onto printed circuit boards for many years. The problem is that the back surface of the device can still be electrically active, which can lead to corrosion and increased temperatures on the back surface. If a heat sink is used for cooling, insulation is often needed on the back surface of the device, which increases device size and cost.

FIG. 1 shows an example of a known device 1 surface mounted onto a printed circuit board 17. The printed circuit board 17 has copper traces 15. Solder bumps 14, separated by polyimide passivation 16, electrically and physically couple the active area 13 of the device to the copper traces 15 on the printed circuit board 17. Device 1 has a sidewall 12 and a back surface 11. Sidewall 12 and back surface 11 are electrically connected to the circuit on the front side.

FIG. 2 shows a heat sink 19 attached to device 1 to conduct heat away from the back surface 11 of the silicon substrate 10. When a heat sink 19 is attached to the back surface 11 of device 1, insulation 18 must be added between the silicon substrate 10 and the heat sink 19 to prevent the heat sink 19 from becoming electrically active through contact with back surface 11 that is electrically connected to the front side. However, the addition of insulation 18 disadvantageously impedes the ability of the heat sink 19 to conduct heat away from the device 1.

Accordingly, a solution to the above-noted problem is needed, namely a device in which the heat sink can be directly connected to the back surface of a surface mounted device without the need for an insulation layer that impedes the passage of heat from the device.

SUMMARY OF THE INVENTION

The present invention solve the above-noted problem in the prior art by the inclusion of an aluminum nitride (AlN) seed layer between the silicon substrate and the AlGaN buffer layer to prevent the silicon substrate from becoming electrically active, and by electrically isolating the active area from the sidewalls of the device.

DETAILED DESCRIPTION OF THE INVENTION

The present invention eliminates the need for an insulation layer, and thereby improves the conduction of heat to the heat sink, by the inclusion of an aluminum nitride (AlN) seed layer between the silicon substrate and the AlGaN buffer layer, which prevents the silicon substrate from becoming electrically active, and by electrically isolating the sidewalls from the active area of the device.

Figure 3:
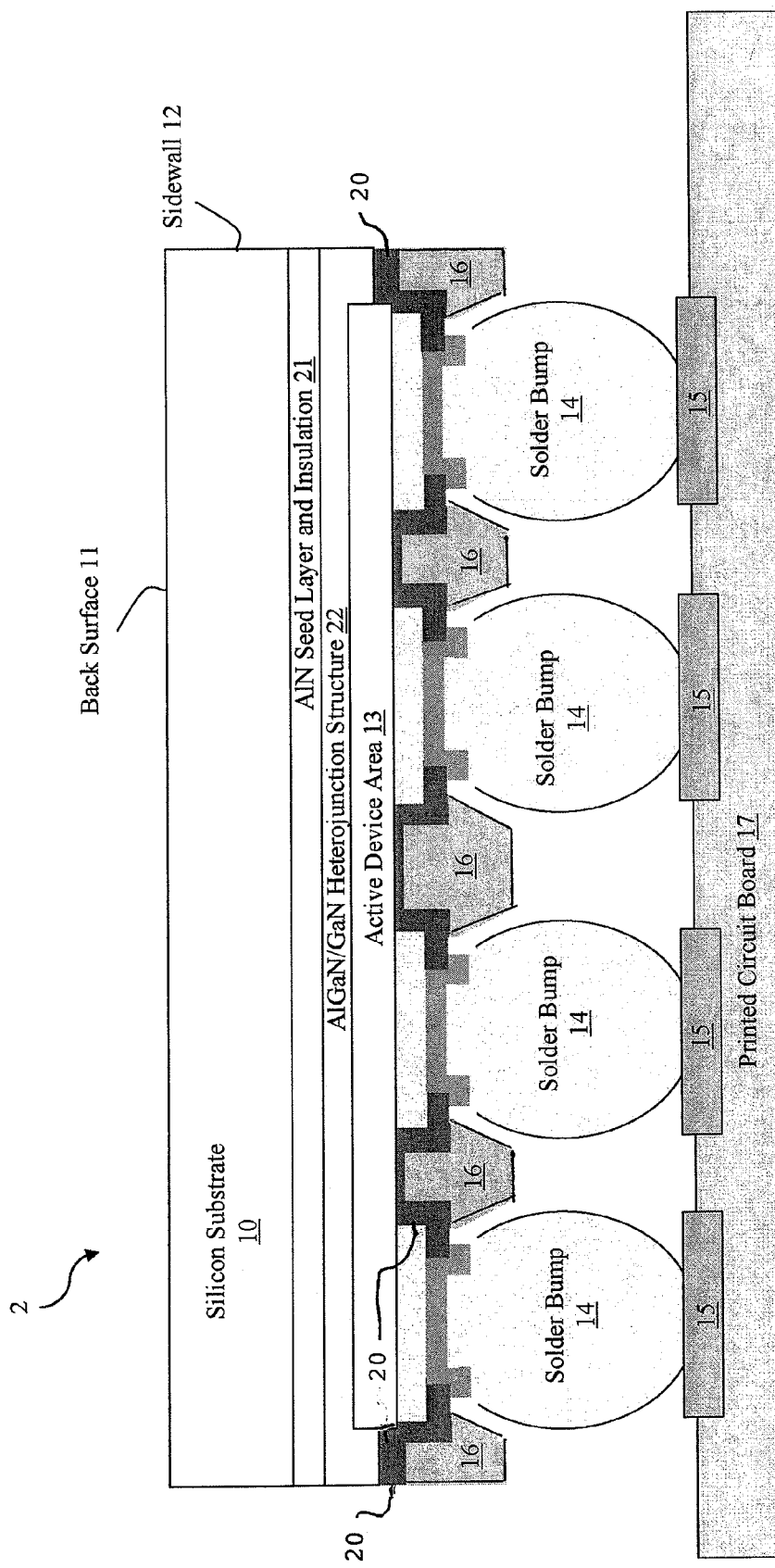
FIG. 3 shows a side view of a device according to the present invention.

FIG. 3 depicts a preferred embodiment of the present invention, an enhancement mode GaN transistor 2 which is surface mounted onto a printed circuit board 17. As in the prior art, solder bumps 14, separated by polyimide passivation 16, electrically and physically couple the active area 13 of the device to copper traces 15 on the printed circuit board 17. The electrical connection to the active area 13 includes at least one gate electrode, at least one drain electrode, and at least two source electrodes, with one of the source electrodes used as a Kelvin connection.

The device 2 of the present invention is formed as follows. A low temperature, mostly amorphous aluminum nitride (AlN) layer is deposited on silicon substrate 10. Then a higher temperature AlN layer is grown, completing the formation of AlN layer 21. The second AlN layer has many crystal imperfections. Next, a layer of AlGaN or InAlGaN is grown over AlN seed layer 21, and the crystal becomes better. An undoped GaN layer is then grown with an even better crystalline structure (AlGaN/GaN heterojunction structure 22). The AlGaN cap of the active device area 13, which is necessary to form the 2DEG, is etched away at the periphery to prevent the 2DEG from reaching the edges of the device. The undoped GaN layer extends to the edges but, like the AlGaN buffer layer and the AlN layer 21 underneath, it does not conduct electricity, thus leaving the edges of the device inactive. The silicon substrate 10 is likewise electrically insulated from the active device area 13 by AlN seed layer 21. A passivation layer 20 is added on top of the active device area which is comprised of insulating material such as silicon dioxide, silicon nitride, aluminum nitride, or various combinations of these compounds. An additional passivation layer 16, comprised of a plastic film such as epoxy or polyimide may be added for additional electrical isolation. As a result of this electrical isolation, corrosion and temperatures on the back surface 11 and sidewalls 12 of device 2 are reduced.

Figure 1:
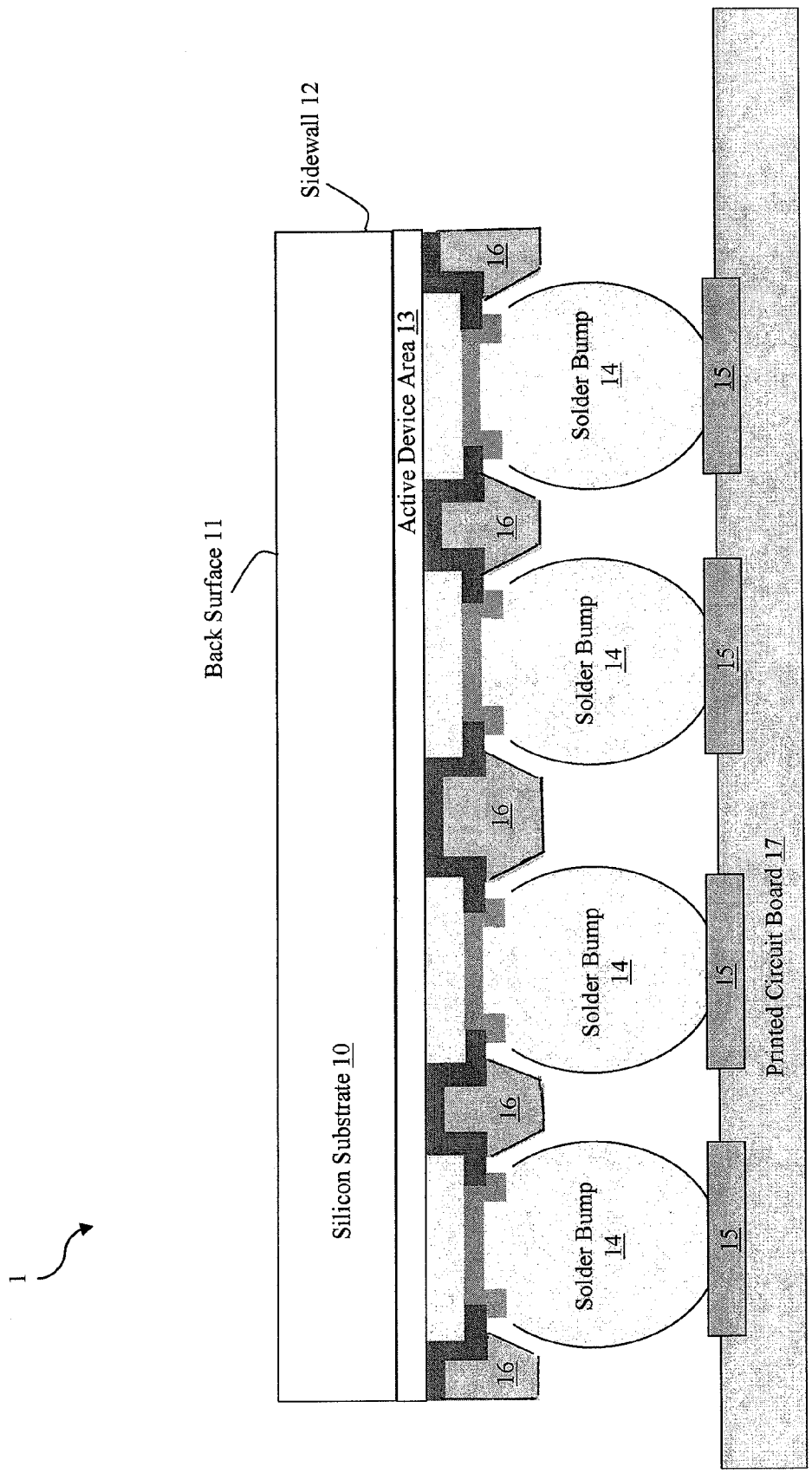
FIG. 1 shows a side view of a prior art device.
Figure 2:
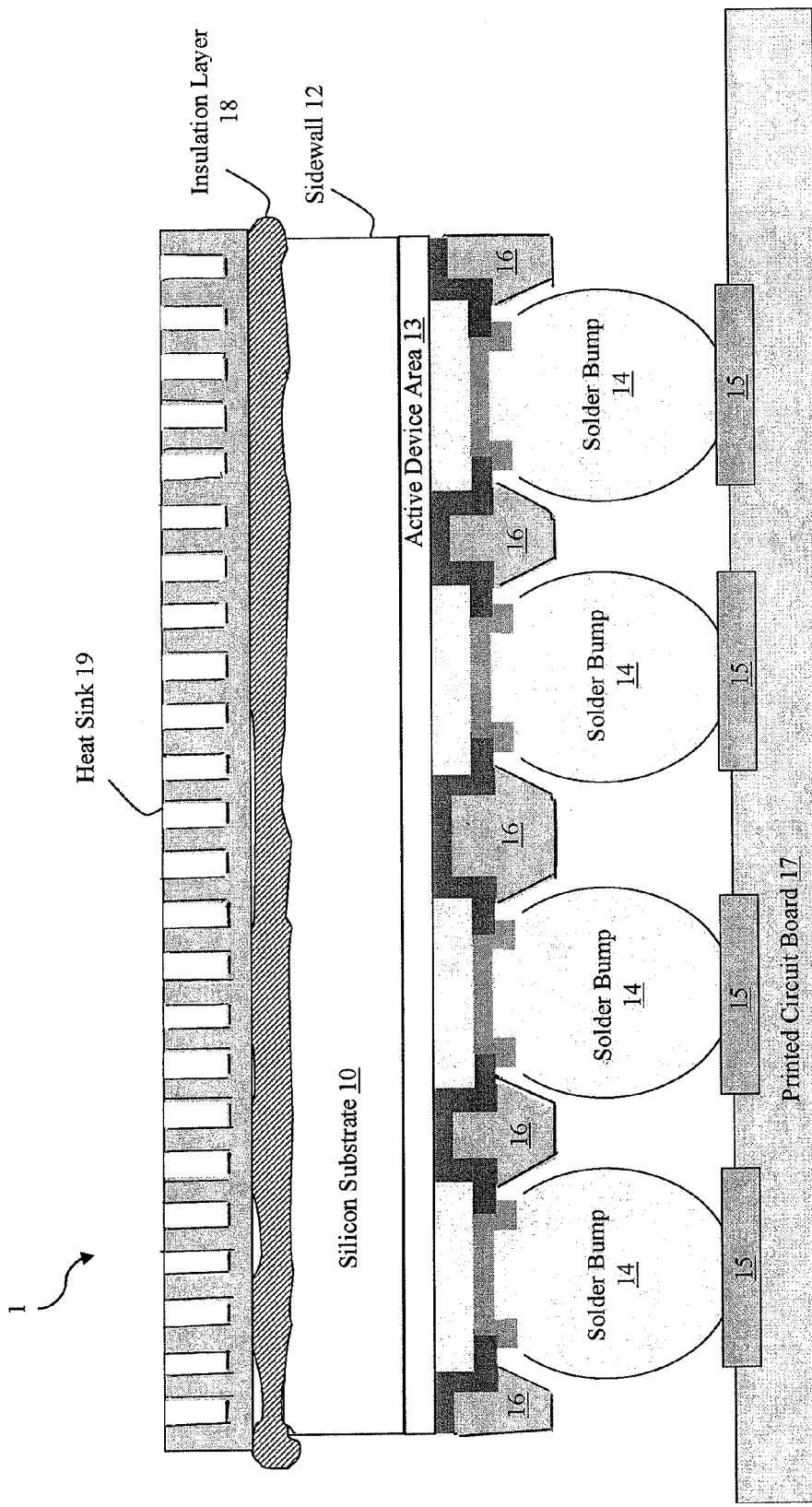
FIG. 2 shows a side view of the prior art device of FIG. 1 with a heat sink attached.
Figure 4:
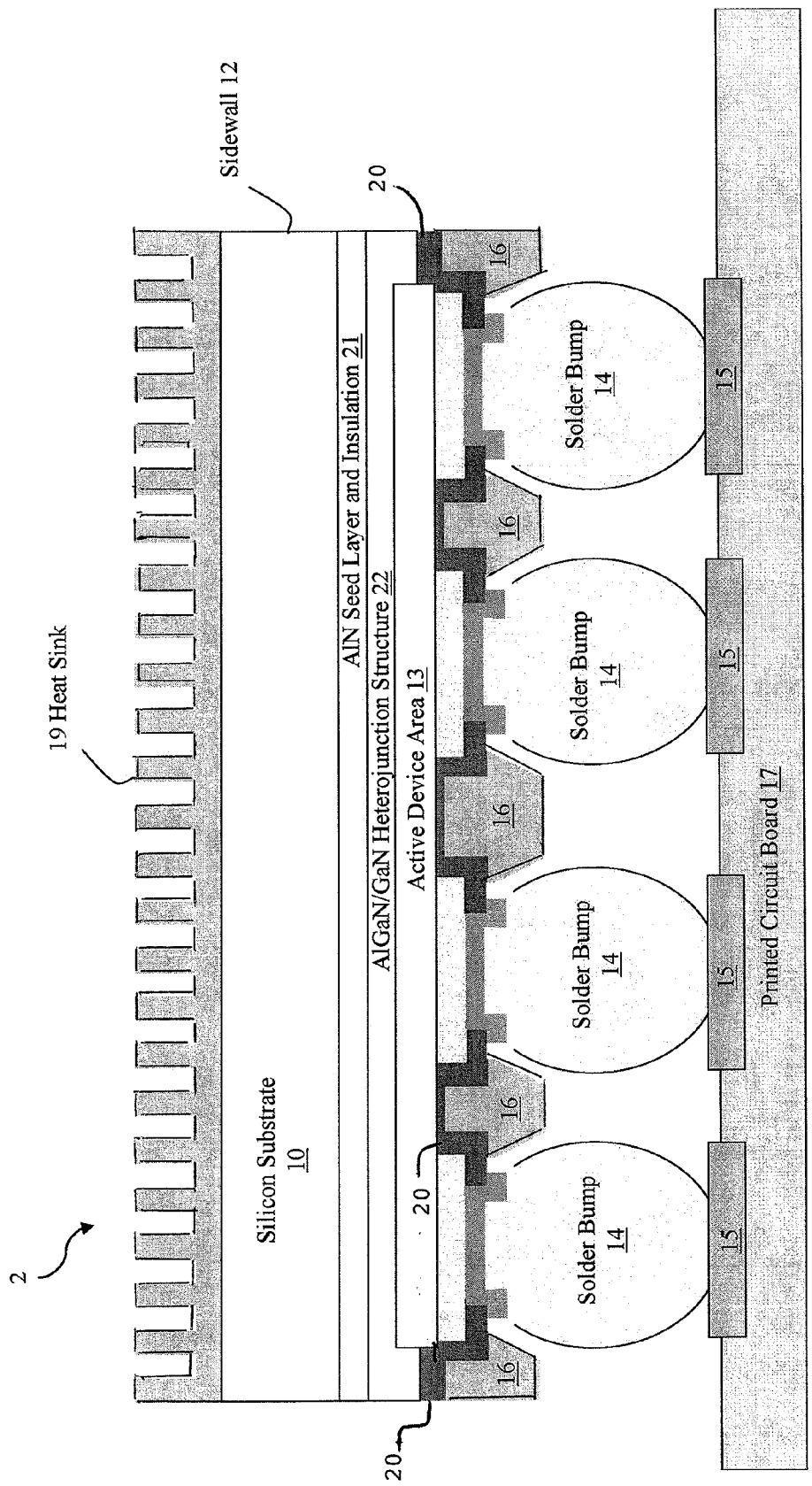
FIG. 4 shows a side view of the device of the present invention with a heat sink attached.

FIG. 4 shows a heat sink 19 attached to the back surface 11 of the device 2 to dissipate heat. The inclusion of the insulating AlN seed layer 21 to electrically isolate the silicon substrate 10, and the electrically isolated side walls, allow the heat sink 19 to be directly connected to the back surface 11 of the device 2 without the need for the insulation layer 18 as shown in FIG. 2. Therefore, the device 2 does not have the problem of device 1 shown in FIG. 2; i.e., there is no thick insulation 18 to impede the ability of the heat sink 19 to conduct heat away from the device. In addition, device 2 is more resistant to humidity than device 1. All that is needed is a surface passivation, preferably silicon nitride, silicon dioxide, or a combination of both, over the top surface of device 2. Overmolding is not required, thus providing a GaN power transistor in a chip scale package.

Various circuits can be formed by integrating multiple active devices of the present invention on a silicon substrate. For example, the GaN transistors of the present invention can be integrated onto a silicon substrate in a half bridge or a full bridge configuration. The GaN power transistors of the present invention can also be driven by smaller driver transistors on the same silicon substrate.

The above description and drawings are only to be considered illustrative of a specific embodiment of the invention which achieves the features and advantages described herein. Modifications and substitutions to the invention can be made.

Accordingly, the embodiment of the invention described herein is not considered as being limited by the foregoing description and drawings.

We claim:

1. A semiconductor device comprising:
   a silicon substrate;
   a compound semiconductor material including an active area;
   an insulating material between the silicon substrate and the active area; and
   a top surface comprising:
   means of electrical connection to the active area, and
   a first passivation material, wherein the passivation material is silicon nitride, silicon dioxide, or a combination of both, and
   wherein the electrical connection includes at least one gate electrode, at least one drain electrode, and at least two source electrodes, wherein one of the source electrodes is used as a Kelvin connection.

2. The device of claim 1, wherein the compound material is formed of various layers comprised of a combination of Indium, Gallium, Nitrogen, and Aluminum.

3. The device of claim 1, wherein the device is an enhancement mode transistor.

4. The device of claim 2, wherein the device is an enhancement mode GaN transistor.

5. The device of claim 1, further comprising a second passivation material of polyimide plastic.

6. The device of claim 1, wherein the active area does not extend to the edges of the device.

7. The device of claim 1, further comprising a heatsink mounted directly to a second surface of the silicon substrate without a layer of insulation between the substrate and the heat sink.

8. The device of claim 1, wherein the electrical connection further comprises a solder bump formed of various combinations of copper, lead, silver, antimony and tin.

9. The device of claim 3, wherein multiple active devices are integrated onto the silicon substrate.

10. The device of claim 3, wherein the transistors are in a half bridge or a full bridge configuration.

11. The device of claim 3, wherein the transistors are driven by smaller driver transistors on the same silicon substrate.

\* \* \* \* \*